US012651890B2

(12) United States Patent
Adams

(10) Patent No.: US 12,651,890 B2
(45) Date of Patent: Jun. 9, 2026

(54) REDUCING AUGER RECOMBINATION IN SEMICONDUCTOR OPTICAL DEVICES

(71) Applicant: University of Surrey, Guildford (GB)

(72) Inventor: Alfred Rodney Adams, Guildford (GB)

(73) Assignee: University of Surrey, Guildford (GB)

( * ) Notice: Subject to any disclaimer, the term of this patent is extended or adjusted under 35 U.S.C. 154(b) by 665 days.

(21) Appl. No.: 17/800,504

(22) PCT Filed: Feb. 26, 2021

(86) PCT No.: PCT/GB2021/050493
§ 371 (c)(1),
(2) Date: Aug. 17, 2022

(87) PCT Pub. No.: WO2021/171031
PCT Pub. Date: Sep. 2, 2021

(65) Prior Publication Data
US 2023/0127367 A1     Apr. 27, 2023

(30) Foreign Application Priority Data
Feb. 27, 2020     (GB) ..................................... 2002785

(51) Int. Cl.
*H01S 5/34* (2006.01)
*H01S 5/042* (2006.01)
(52) U.S. Cl.
CPC .......... *H01S 5/3403* (2013.01); *H01S 5/0421* (2013.01); *H01S 2301/17* (2013.01)
(58) Field of Classification Search
CPC .................................................. H01S 5/3422
See application file for complete search history.

(56) References Cited

U.S. PATENT DOCUMENTS 6,353,624 B1     3/2002 Pelekanos et al.
6,573,530 B1     6/2003 Sargent et al.
(Continued)

FOREIGN PATENT DOCUMENTS

CN     103119810 A     5/2013
EP     0485237          5/1992
(Continued)

OTHER PUBLICATIONS

Stephen J. Sweeney et al.; The impact of strained layers on current and emerging semiconductor laser systems. J. Appl. Phys. Feb. 28, 2019; 125 (8): 082538. https://doi.org/10.1063/1.5063710 (Year: 2019).*
(Continued)

*Primary Examiner* — Minsun O Harvey
*Assistant Examiner* — Stephen Sutton Kotter
(74) *Attorney, Agent, or Firm* — Umberg Zipser LLP; Ryan Dean

(57) ABSTRACT

A semiconductor optical device (40, 50, 60) comprises a first region 42 comprising an active region configured such that electrons and holes recombine in the active region to produce photons when a voltage is applied to the device. The device comprises at least one second region (43, 44, 53, 54, 62, 63) comprising a quantum well structure which is configured to trap electrons only, to trap holes only, or to trap different amounts of electrons and holes. The second region is arranged at a distance from the first region which is sufficiently close to the first region such that a charge imbalance develops in the first region when a voltage is applied to the device, thereby to reduce Auger recombination in the first region.

20 Claims, 5 Drawing Sheets

(56)                    References Cited

U.S. PATENT DOCUMENTS

| 2005/0092979 | A1 | 5/2005 | Han, II et al. | |
| 2005/0173694 | A1 | 8/2005 | Mawst et al. | |
| 2010/0097690 | A1 | 4/2010 | Vurgaftman et al. | |
| 2012/0269221 | A1* | 10/2012 | Vurgaftman ..........  | H01S 5/3407 |
| | | | | 372/45.01 |
| 2014/0146837 | A1 | 5/2014 | Adams | |
| 2017/0125979 | A1* | 5/2017 | Yang ..................... | H01S 5/3403 |

FOREIGN PATENT DOCUMENTS

| EP | 0543587 | 5/1993 |
| JP | H11261170  A | 9/1999 |
| JP | 2012507142  A | 3/2012 |

OTHER PUBLICATIONS

Japan Patent Office, Office Action, Oct. 1, 2024.
Bhattacharya et al., Tunneling Injection Lasers: A New Class of Lasers with Reduced Hot Carrier Effects, IEEE Journal of Quantum Electronics, IEEE Service Center, Piscataway, NJ, vol. 32, No. 9, Sep. 1, 1996, XP011051458, p. 1621, para. 2, fig. 2.
European Patent Office, International Search Report and Written Opinion, May 26, 2021, 12 pages.
Japanese Office Action dated Jan. 21, 2025, and Englishe translation.
CN Office Action dated Mar. 1, 2025 and English Translation.
PCT Search Report dated Feb. 26, 2025.
UKIPO, Search Report, mailed Aug. 7, 2020, Appl. No. GB2002785. 0.
Japan Patent Office, Office Action, dated Jan. 28, 2026, appl. No. 2025-087630.

* cited by examiner $\sim n^2 p$ $\sim p^2 n$

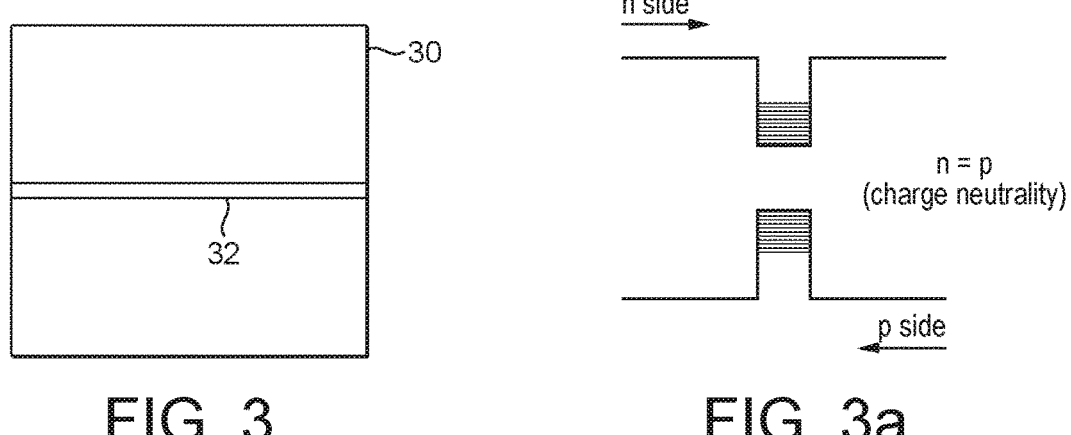
FIG. 3
FIG. 3a
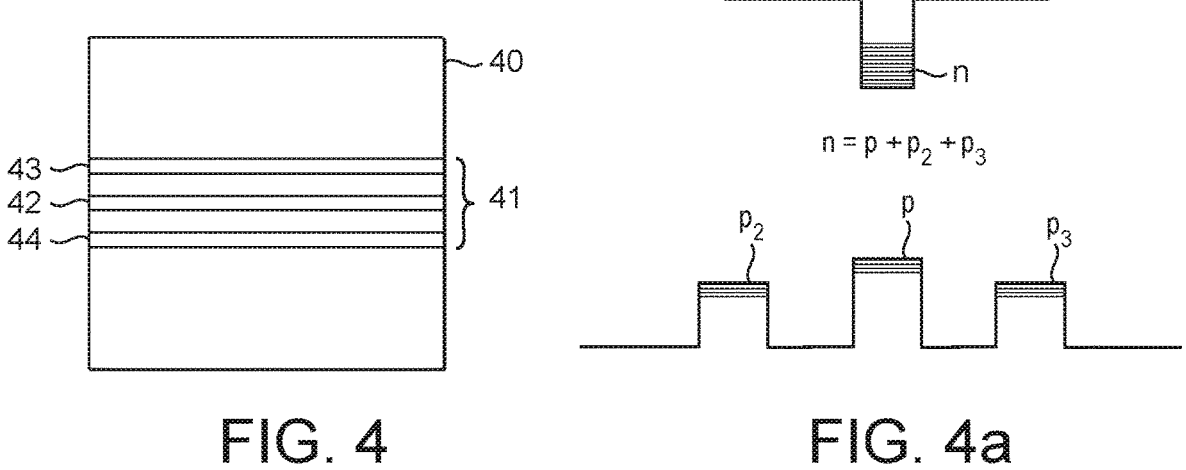
FIG. 4
FIG. 4a

REDUCING AUGER RECOMBINATION IN SEMICONDUCTOR OPTICAL DEVICES

FIELD

The present disclosure relates to reducing Auger recombination in semiconductor optical devices such as quantum well lasers.

BACKGROUND

In many applications, the temperature of a semiconductor laser has to be carefully controlled using a cooling unit to stabilise the output power. Such cooling units may use a significant amount of electrical power, e.g. significantly more than the laser itself. In addition, cooling units such as piezoelectric coolers may be the first component of a semiconductor which fails with time, effectively limiting the lifetime of the laser system.

U.S. Pat. No. 8,937,978 B2, from the present applicant, describes a semiconductor laser having an active layer which comprises alternating layers of a first and second material. The n-side barrier layer and p-side barrier layer each comprise alternating layers of the first material and a third material. The materials are selected such that the layers of the second and third materials form quantum wells between the layers of the first material. A band gap $Eg$ of the second material is arranged such that a proportion of electrons and holes that recombine across the band gap $Eg$ recombine to emit photons at the lasing wavelength, the proportion decreasing with increasing temperature of the optical cavity. A band gap $Ec$ of the third material is arranged such that a ratio of electrons and holes that recombine across the band gap $Eg$ of the second material to electrons and holes that recombine across the band gap $Ec$ of the third material increases with increasing temperature of the optical cavity. Over a range of temperatures at which the semiconductor laser is intended to operate, the increasing ratio compensates for the decreasing proportion so as to reduce change with temperature of the optical cavity in the rate at which electrons and holes recombine across the band gap $Eg$ of the second material to emit photons at the lasing wavelength.

In this way, the output power of the laser of U.S. Pat. No. 8,937,978 is less sensitive to temperature variations compared to conventional semiconductor lasers, but this comes at the expense of an increased lasing threshold. The development of a low-threshold, temperature-insensitive semiconductor laser has defied many years of research and development.

SUMMARY

Auger recombination is a fundamental physical process which is detrimental to the performance of semiconductor lasers and other semiconductor optical devices. More specifically, Auger recombination is a non-radiative process which reduces the efficiency of a semiconductor laser and increases its threshold current.

Various embodiments described herein reduce Auger recombination in semiconductor optical devices.

In one example implementation, a semiconductor optical device comprises a first region comprising an active region configured such that electrons and holes recombine in the active region to produce photons when a voltage is applied across the device. The device further comprises at least one second region comprising a quantum well structure which is configured to preferentially trap either electrons or holes.

The quantum well structure may be configured to trap electrons only, to trap holes only, or to trap different numbers of electrons and holes.

Thus, the quantum well structure in the second region may be designed to trap charge carriers in the form of electrons and/or holes, wherein more than 50% of the charge carriers that are trapped by the quantum well structure may be of the same type, i.e. one of either electrons or holes. Alternatively, in various embodiments, more than 55%, more than 60%, more than 70%, more than 80%, more than 90%, more than 95% or more than 99% of the charge carriers that are trapped by the quantum well structure may be of the same type, i.e. one of electrons or holes.

In some examples the quantum well structure in the second region comprises a type II quantum well structure which provides a quantum well for holes but not electrons. In other examples the quantum well structure in the second region comprise a type II quantum well structure which provides a quantum well for electrons but not for holes.

The second region is located sufficiently close to the active region so as to alter the charge balance within the active region but is sufficiently far away from the active region so that it does not recombine with that charge.

Provided that the second region is positioned sufficiently close to the first region, a charge imbalance develops in the first region when a voltage is applied to the device. The charge imbalance reduces Auger recombination in the first region.

Those skilled in the art cognizant of the present disclosure will understand that the "active region" of the device is the region in which photons are generated. In the second region, carriers are stored but do not take part in any recombination process and are therefore not active in emitting photons. Thus, the or each second region may be referred to as an inactive region. In some embodiments, the first region may be the only active region of the device.

In various embodiments the second region is grown under tensile strain or under substantially unstrained conditions. The first region may be grown under compressive strain.

In some embodiments two or more second regions may be provided, e.g. on opposite sides of the first region. Each second region may contribute to the charge imbalance which develops in the first region.

The device may comprise a semiconductor laser or amplifier. For example, the device may comprise a quantum well laser.

The term "optical" as used herein in the term "optical device" should not be understood to mean it is essential that the device generates light in the visible part of the electromagnetic spectrum; those skilled in the art will appreciate that the optical devices described herein may generate radiation within or outside of the visible range, for example in the infrared, including at wavelength beyond 2 μm, or in the ultraviolet, or at other wavelengths within the electromagnetic spectrum.

BRIEF DESCRIPTION OF THE DRAWINGS

So that this disclosure may be more fully understood, various embodiments thereof will now be described with reference to the accompanying figures, in which:

FIG. 3 is a general schematic illustration of a known quantum well laser;

FIG. 3a shows the bandgap diagram for the conduction and valence bands of the quantum well laser of FIG. 3; the diagram shows the lowest allowed energy for electrons in the conduction band and the highest allowed energy for holes in the valence band as a function of position through the structure;

FIG. 4 schematically illustrates a quantum well laser in accordance with a first embodiment;

FIG. 4a shows the bandgap diagram for the conduction and valence bands of the quantum well laser of FIG. 4;

DETAILED DESCRIPTION

Figure 1:
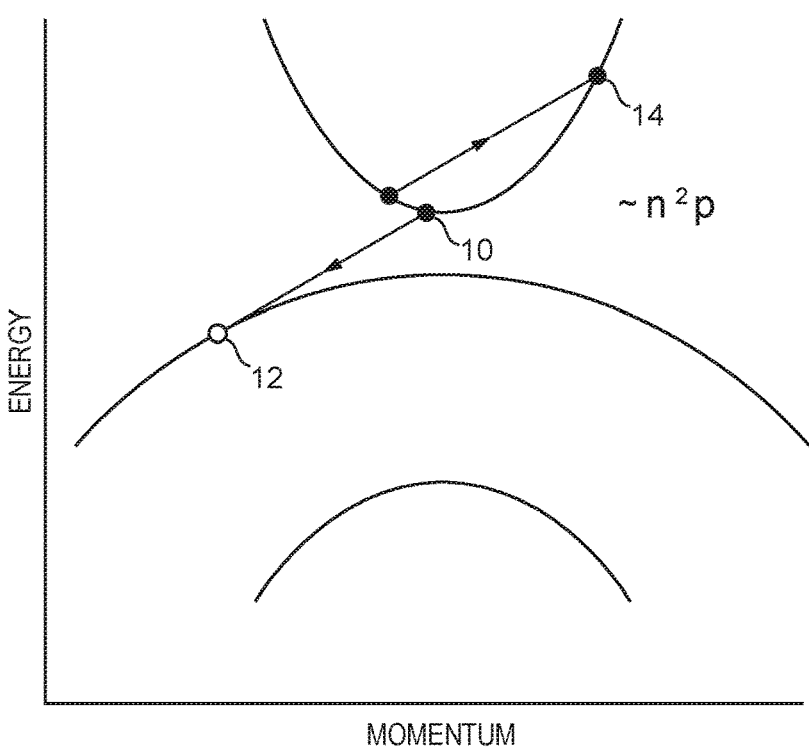
FIG. 1 shows an energy-momentum diagram for a first Auger recombination process (CHCC process)

FIG. 1 illustrates an Auger recombination process (CHCC process) in which an electron 10 and hole 12 recombine nonradiatively by transferring their energy to another electron 14. Since two electrons are involved the probability that this process occurs is proportional to $n^2p$ where n is the electron density and p is the hole density.

Figure 2:
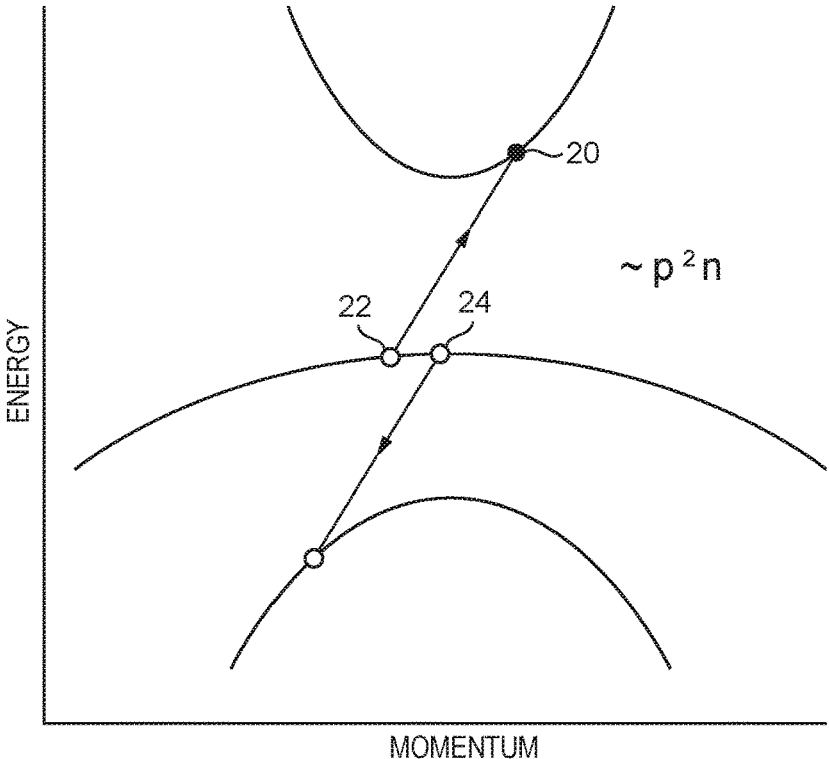
FIG. 2 shows an energy-momentum diagram for a second Auger recombination process (CHSH process)

FIG. 2 illustrates another type of Auger recombination process (CHSH process) in which an electron 20 and hole 22 recombine nonradiatively by transferring their energy to another hole 24. Since two holes are involved the probability that this process occurs is proportional to $p^2n$ where p is the hole density and n is the electron density.

The probability for both the CHCC and the CHSH processes increase with temperature. However, depending on the lasing wavelength that a particular quantum well laser is designed for, the material properties of the laser may be such that one of these processes is more probable than the other and may dominate. For example, for short-wavelength materials (i.e. materials designed for lasing at shorter wavelengths), the bandgap may be larger than the spin-orbit split off energy such that the CHSH process dominates. However for long-wavelength materials (i.e. materials designed for lasing at longer wavelengths), the bandgap may be smaller so that the CHSH process becomes less probable or even impossible, in which case the CHCC process may dominate.

FIG. 3 is a general schematic illustration of a known quantum well laser 30 having a quantum well structure 32 configured such that electrons and holes recombine in the quantum well structure to produce photons when a voltage is applied to the electrodes (not shown) of the laser. The quantum well laser is designed for operation at a relatively short wavelength (e.g. a near-infrared wavelength such as 1.55 μm or 1.3 μm) so that the CHSH process dominates over the CHCC process. FIG. 3a shows the bandgap diagram for the conduction and valence bands of the quantum well structure 32. The number (and therefore density) of electrons n is equal to the number (and therefore density) of holes p so that the quantum well structure 32 is charge neutral.

FIG. 4 schematically illustrates a quantum well laser 40 in accordance with a first embodiment. The quantum well laser 40 includes a layer structure 41 comprising an active layer in the form of a first quantum well structure 42 configured such that electrons and holes recombine in the quantum well structure 42 to produce photons. The quantum well structure 42 is similar to the quantum well structure of 32 in that it is designed for operation at relatively short wavelength (e.g. a near-infrared wavelength such as 1.55 μm or 1.3 μm) so that the CHSH process dominates over the CHCC process.

The quantum well structure 42 is configured to trap both electrons and holes. Therefore electrons are able to recombine with the holes and emit photons. The quantum well structure 42 is therefore the active well of the laser 40.

The layer structure 41 further comprises a second quantum well structure 43 and a third quantum well structure 44. The second and third quantum well structures 43, 44 are positioned on opposite sides of the first quantum well structure 42.

The second and third quantum well structures 43, 44 are designed to accommodate holes but not electrons, i.e. the quantum well structures 43, 44 act as a "trap" for holes but not for electrons. Since the second and third regions trap holes but not electrons the carriers stored therein do not undergo any recombination and therefore do not emit photons and so may be referred to as "inactive".

Figure 7:
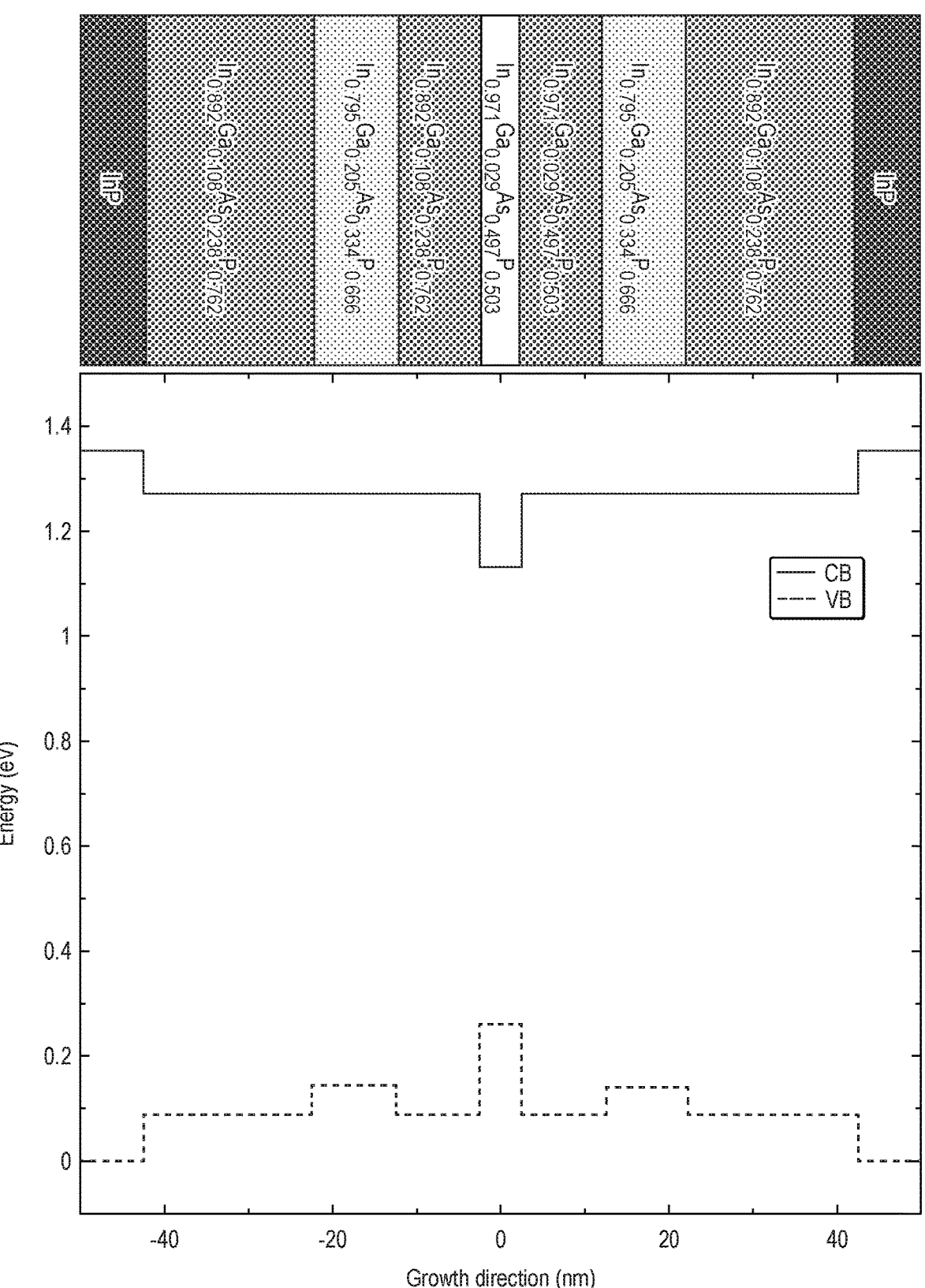
FIG. 7 illustrates the bandgap diagram and alloy structure for a quantum well laser configured to operate at a near-infrared wavelength.

One possible alloy structure to achieve subsidiary wells for holes is illustrated in FIG. 7 together with the corresponding calculated bandgap diagram. However it will be understood that this example is not intended to be limiting and that other alloy structures could be used to achieve suitable subsidiary wells for holes.

Returning to FIG. 4, note that the second 43 and third 44 quantum well structures are sufficiently close to the first quantum well structure 42 to allow thermal distribution of charge carriers from the first quantum well structure 42 to the second and third quantum well structures 43, 44. A simplified version of the bandgap diagram for the layer structure 41 is shown in FIG. 4a, for illustrative purposes. As shown, an appreciable number of holes have become trapped in the second and third quantum wells 43, 44.

Overall, the device 40 is charge neutral, so that the electron density n in the first quantum well structure 42 is equal to the sum of the hole densities p, $p_2$ and $p_3$ in the first 42, second 43 and third 44 quantum well structures respectively. That is, $n=p+_2+p_3$. It follows that the hole density p in the first quantum well structure 42 is less than the electron density n in the first quantum well structure 42. That is, the first quantum well structure has a charge imbalance (fewer holes than electrons) due to the presence of the hole-trapping second and third quantum well structures 43, 44. Since the rate of the CHSH Auger process is proportional to $p^2n$, it follows that the rate of the CHSH Auger process has been reduced in the quantum well laser 40 compared to the quantum well laser 30 shown in FIG. 3. It will be understood that since the hole density p is decreased, the electron density n should be increased in order to achieve lasing so that the product np remain approximately the same. However since $p^2n$ decreases, the rate of the CHSH Auger process is reduced.

The rate of the CHCC process is proportional to $n^2p$ and is therefore increased by the charge imbalance (since there are more electrons than holes). However, as explained above, in the quantum well laser 40 the CHSH process dominates over the CHCC process so that overall Auger recombination is reduced.

For longer wavelength lasers the CHCC process may dominate over the CHSH process. In that case, the second and third quantum well structures may be designed as traps for electrons but not holes.

Figures 5, 5A:
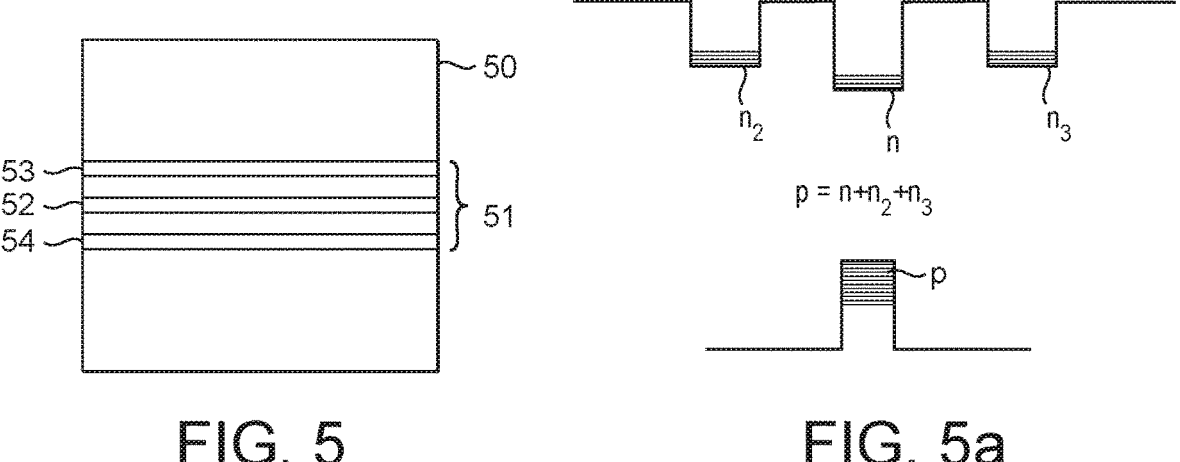
FIG. 5 schematically illustrates a quantum well laser in accordance with a second embodiment.
FIG. 5a shows the bandgap diagram for the conduction and valence bands of the quantum well laser of FIG. 5.

FIG. 5 schematically illustrates such a longer wavelength quantum well laser 50 in accordance with a second embodiment. The quantum well laser 50 includes a layer structure 51 comprising an active layer in the form of a first quantum well structure 52 configured such that electrons and holes recombine in the quantum well structure 52 to produce photons. The quantum well structure 52 is designed for longer wavelengths (e.g. mid-infrared wavelengths such above 2-3 µm) so that the CHCC process dominates over the CHSH process.

The quantum well structure 52 is configured to trap both electrons and holes. Therefore electrons are able to recombine with the holes and emit photons. The quantum well structure 52 is therefore the active well of the laser 50.

The layer structure 51 further comprises a second quantum well structure 53 and a third quantum well structure 54. The second and third quantum well structures 53, 54 are positioned on opposite sides of the first quantum well structure 52.

The second and third quantum well structures 53, 54 are designed to accommodate electrons but not holes, i.e. the quantum well structures 53, 54 act as a "trap" for electrons but not for holes. Since the second and third regions trap electrons but not holes the carriers stored therein do not undergo any recombination and therefore do not emit photons and so may be referred to as "inactive".

Figure 8:
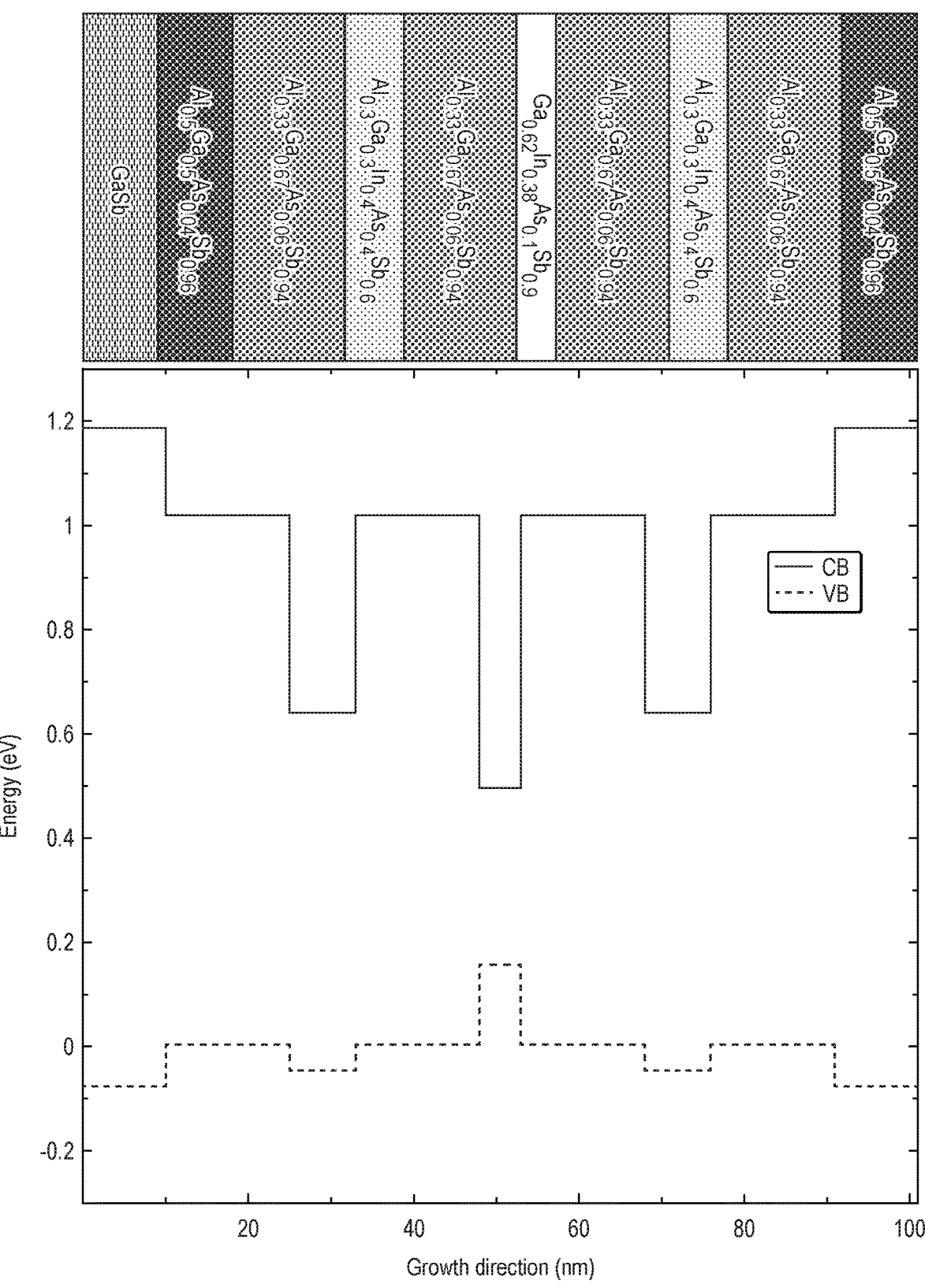
FIG. 8 illustrates the bandgap diagram and alloy structure for a quantum well laser configured to operate at a mid-infrared wavelength.

One possible alloy structure to achieve subsidiary wells for electrons is illustrated in FIG. 8 together with the corresponding calculated bandgap diagram. However it will be understood that this example is not intended to be limiting and that other alloy structures could be used to achieve suitable subsidiary wells for electrons.

Returning to FIG. 5a, note that the second 53 and third 54 quantum well structures are sufficiently close to the first quantum well structure 52 to allow thermal distribution of charge carriers from the first quantum well structure 52 to the second and third quantum well structures 53, 54. A simplified version of the bandgap diagram for the layer structure 51 is shown in FIG. 5a, for illustrative purposes. As shown, an appreciable number of electrons have become trapped in the second and third quantum wells 53, 54.

Overall, the device 50 is charge neutral, so that the sum of the electron densities n, $n_2$ and $n_3$ in the first, second and third quantum well structure 52 is equal to hole density p in the first quantum well structure 52. That is, $p=n+n_2+n_3$. It follows that the electron density n in the first quantum well structure 52 is less than the hole density p in the first quantum well structure 52. That is, the first quantum well structure 52 has a charge imbalance (fewer electrons than holes) due to the presence of the second and third quantum well structures 53, 54. Since the rate of the CHCC Auger process is proportional to $n^2p$, it follows that the rate of the CHCC Auger process has been reduced in the quantum well laser 40 compared to the quantum well laser 30 shown in FIG. 3. The rate of the CHSH process is proportional to $p^2n$ and is therefore increased by the charge imbalance. However, as explained above, in the quantum well laser 50 the CHCC process dominates over the CHSH process so that overall Auger recombination is reduced.

As noted above various embodiments of the present disclosure provide second and third quantum well structures which are positioned sufficiently close to a first quantum well structure to allow charge carriers to move between the first, second and third structures. However if the second and third quantum well structures are too close to the first quantum well structure, Auger recombination might become possible between the different quantum well structures, potentially reducing efficiency. For example in the case of FIG. 4, electrons in the first quantum well structure 42 and corresponding holes in the second 43 or third quantum well structures 42, 43 might recombine non-radiatively. In the example of FIG. 5, holes in the first quantum well structure 52 and corresponding electrons in the second or third quantum well structures 53, 54 might recombine non-radiatively.

To avoid this, the second and third quantum well structures may be located sufficiently close to the first quantum well structure to permit movement of charge carriers between them, but sufficiently far from the first quantum well structure to prevent or limit Auger recombination between the first quantum well structure and the second or third quantum well structures.

In the example of FIG. 4, the second and third quantum well structures 43, 44 are designed to accommodate holes but not electrons, i.e. the quantum well structures 43, 44 acts as a "trap" for holes but not for electrons. However even if the quantum well structures 43, 44 capture some electrons, reduction of Auger recombination can still be achieved if the quantum well structures 43, 44 trap more holes than electrons. Similarly, even if the quantum well structures 53, 54 of FIG. 5 capture some holes, reduction of Auger recombination can still be achieved in the example of FIG. 5 if the quantum well structures 53, 54 capture more electrons than holes.

In manufacture, layers comprising a quantum well structure which is configured to trap only one type of charge carrier (i.e. electrons or holes), or to trap more of one type of charge carrier than the other, may be grown under tensile strain or under unstrained conditions. Since tensile strain increases the density of states, more of one type of charge carrier may be trapped in a tensile strained layer. Thus, the second and third quantum well structures may comprise tensile strained layers. The active layer may be grown under compressive strain, i.e. the first quantum well structure may comprise a compressively strained layer.

Although FIGS. 4 and 5 each illustrate second and third quantum well structures, Auger recombination may still be reduced if one of the second or third quantum well structures is omitted.

Figure 6:
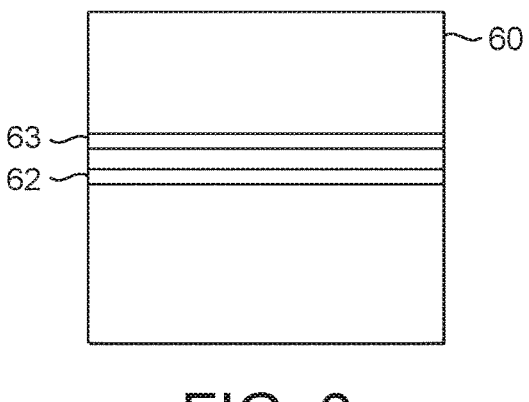
FIG. 6 schematically illustrates a quantum well laser in accordance with a third embodiment.

FIG. 6 schematically illustrates a semiconductor optical device 6o in accordance with a third embodiment. The device may comprise a semiconductor laser or amplifier. The device includes a first region 62 comprising an active region configured such that electrons and holes recombine in the active region to produce photons when a voltage is applied to the electrodes (not shown) of the device. The device further comprises at least one second region comprising a quantum well structure 63 which is configured to preferentially trap one of electrons or holes. For example, the quantum well structure 63 may be configured to trap electrons only, to trap holes only, or to trap different amounts of electrons and holes (i.e the quantum well structure does not trap the same number of electrons and holes). The quantum well structure 63 is arranged at a distance from the first region 62 which is sufficiently close to the first region such that a charge imbalance develops in the first region 62 when a voltage is applied to the device 60, thereby to reduce Auger recombination in the first region. The second region may be sufficiently far from the first region to prevent or limit Auger recombination between first charge carriers in the first region 62 and second charge carriers in the second region 63. In some embodiments, the at least one second region may comprise two quantum well structures positioned on opposite sides of the first region 62.

In some embodiments, the semiconductor optical device 60 may comprise an additional structure such as the structure described in U.S. Pat. No. 8,937,978. The first region 62 may have a first bandgap arranged such that the proportion of electrons and holes that recombine across the first bandgap recombine to emit photons decreases with increasing temperature. The additional structure comprises one or more additional bandgaps, the first and one or more additional bandgaps being arranged such that a ratio of electrons and holes that recombine across the first bandgap to electrons and holes that recombine across the one or more additional band gaps increases with increasing temperature. Over a range of temperatures at which the semiconductor optical device is intended to operate, the increasing ratio compensates for the decreasing proportion so as to reduce change with temperature of the rate at which electrons and holes recombine across the first band gap to emit photons.

In this way, a low-threshold semiconductor laser having an output power with a reduced sensitivity to temperature may be provided.

Many modifications and variations will be evident to those skilled in the art, that fall within the scope of the following claims:

The invention claimed is:

1. A semiconductor optical device comprising:
a first region comprising an active region configured such that electrons and holes recombine in the active region to produce photons when a voltage is applied to the device; and
at least one second region comprising a quantum well structure which is configured to trap electrons only, to trap holes only, or to trap different amounts of electrons and holes,
wherein the second region is arranged at a distance from the first region such that a charge imbalance develops in the first region when a voltage is applied to the device, thereby to reduce Auger recombination in the first region, and
wherein one or more material properties of the first region are such that first and second Auger recombination processes contribute to Auger recombination in the first region, wherein the charge imbalance causes the rate of the first Auger recombination process to increase and the rate of the second Auger recombination process to decrease such that overall Auger recombination in the first region is reduced.

2. A semiconductor optical device according to claim 1, wherein the second region comprises a type-II quantum well structure which is configured to trap electrons only or to trap holes only.

3. A semiconductor optical device according to claim 1, wherein the first region comprises a quantum well structure which is configured to trap both electrons and holes.

4. A semiconductor optical device according to claim 3, wherein the first region comprises a type-I quantum well structure.

5. A semiconductor optical device according to claim 1, wherein the second region is arranged at a distance from the first region to prevent or limit Auger recombination between first charge carriers in the first region and second charge carriers in the second region.

6. A semiconductor optical device according to claim 1, comprising at least two second regions positioned on opposite sides of the first region, wherein each of the second regions are arranged at a distance from the first region such that a charge imbalance develops in the first region when a voltage is applied to the device, thereby to reduce Auger recombination in the first region.

7. A semiconductor optical device according to claim 1, wherein the second region comprises a tensile-strained layer.

8. A semiconductor optical device according to claim 1 wherein the second region comprises an unstrained layer.

9. A semiconductor optical device according to claim 1, wherein the first region comprises a compressively-strained layer.

10. A semiconductor optical device according to claim 1, wherein the first region has a first bandgap arranged such that the proportion of electrons and holes that recombine across the first bandgap decreases with increasing temperature, the device comprising:
an additional structure with one or more additional bandgaps, the first and one or more additional bandgaps being arranged such that a ratio of electrons and holes that recombine across the first bandgap to electrons and holes that recombine across the one or more additional band gaps increases with increasing temperature of the device,
wherein, over a range of temperatures at which the semiconductor optical device is intended to operate, the increasing ratio compensates for the decreasing proportion so as to reduce change with temperature of the rate at which electrons and holes recombine across the first band gap to emit photons.

11. A semiconductor optical device according to claim 1, wherein the device comprises a semiconductor laser or a semiconductor optical amplifier.

12. A semiconductor optical device according to claim 1, wherein the first region comprises a quantum well and wherein the device comprises a quantum well laser.

13. A semiconductor optical device according to claim 1, wherein the second region is an inactive region.

14. The semiconductor optical device according to claim 1, wherein the first Auger recombination process is a CHCC process and the second Auger recombination process is a CHSH process.

15. The semiconductor optical device according to claim 1, wherein the first Auger recombination process is a CHSH process and the second Auger recombination process is a CHCC process.

16. A method of manufacturing a semiconductor optical device, comprising:
growing a first semiconductor region and at least one second semiconductor region, wherein:
the first region comprises an active region configured such that electrons and holes recombine in the active region to produce photons when a voltage is applied to the device, and
the at least one second region comprises a quantum well structure which is configured to trap electrons only, to trap holes only, or to trap different amounts of electrons and holes, each or the second region being arranged at a distance from the first region so as to cause a charge imbalance to develop in the first region when a voltage is applied to the device, thereby to reduce Auger recombination in the first region,
wherein one or more material properties of the first region are such that first and second Auger recombination processes contribute to Auger recombination in the first region, wherein the charge imbalance causes the rate of the first Auger recombination process to increase and the rate of the second Auger recombination process to decrease such that overall Auger recombination in the first region is reduced.

17. The method of claim 16, comprising growing the quantum well structure under tensile strain or under unstrained conditions.

18. The method of claim 16, comprising growing the first region under compressive strain.

19. The method of claim 16, wherein the first Auger recombination process is a CHCC process and the second Auger recombination process is a CHSH process.

20. The method of claim 16, wherein the first Auger recombination process is a CHSH process and the second Auger recombination process is a CHCC process.

\* \* \* \* \*